(12) United States Patent
Park et al.

(10) Patent No.: US 6,987,695 B2
(45) Date of Patent: Jan. 17, 2006

(54) WRITING DATA TO NONVOLATILE MEMORY

(75) Inventors: Jongmin Park, Fremont, CA (US); Li-Chun Li, Los Gatos, CA (US)

(73) Assignee: ProMOS Technologies Inc., Hsin Chu (TW)

( * ) Notice: Subject to any disclaimer, the term of this patent is extended or adjusted under 35 U.S.C. 154(b) by 212 days.

(21) Appl. No.: 10/397,882

(22) Filed: Mar. 25, 2003

(65) Prior Publication Data

US 2004/0190344 A1 Sep. 30, 2004

(51) Int. Cl.
*G11C 16/04* (2006.01)
*G11C 16/06* (2006.01)

(52) U.S. Cl. .......................... 365/185.18; 365/185.19; 365/185.22

(58) Field of Classification Search ........... 365/185.11, 365/185.18, 185.19, 185.22, 185.33
See application file for complete search history.

(56) References Cited

U.S. PATENT DOCUMENTS

| | | | | |
|---|---|---|---|---|
| 5,627,782 A | * | 5/1997 | Tanaka et al. | 365/185.18 |
| 5,644,531 A | | 7/1997 | Kuo et al. | |
| 5,708,600 A | * | 1/1998 | Hakozaki et al. | 365/185.18 |
| 5,932,908 A | | 8/1999 | Noble | |
| 6,081,453 A | * | 6/2000 | Iwahashi | 365/185.22 |
| 6,424,569 B1 | | 7/2002 | Parker et al. | |
| 6,442,074 B1 | | 7/2002 | Colarelli, III et al. | |
| 6,434,055 B2 | | 8/2002 | Tanaka et al. | |
| 6,438,033 B2 | | 8/2002 | Roohparvar | |
| 6,459,618 B1 | | 10/2002 | Wang | |
| 6,567,305 B2 | * | 5/2003 | Nakamura | 365/185.11 |
| 6,809,967 B2 | * | 10/2004 | Noguchi et al. | 365/185.22 |
| 2001/0053092 A1 | | 12/2001 | Kosaka et al. | |
| 2002/0000373 A1 | | 1/2002 | Tanzawa et al. | |

* cited by examiner

*Primary Examiner*—Trong Phan
(74) *Attorney, Agent, or Firm*—Michael Shenker; MacPherson Kwok Chen & Heid LLP

(57) ABSTRACT

In some embodiments, of the present invention, data are written to a plurality of nonvolatile memory cells (Q0, Q15) as follows. A data writing signal is supplied to one of the memory cells (Q0) but not to both of the memory cells. Then data writing signals are supplied to both of the memory cells simultaneously.

32 Claims, 5 Drawing Sheets

WRITING DATA TO NONVOLATILE MEMORY

BACKGROUND OF THE INVENTION

The present invention relates to writing data to a nonvolatile memory.

FIG. 1 illustrates the operations performed to program a word of a flash memory. The memory cells are programmed by channel hot electron injection (CHIE). Channel hot electron injection is described, for example, in "Nonvolatile Semiconductor Memory Technology" (edited by W. D. Brown et al., 1998), pages 17–23, incorporated herein by reference.

The memory is programmed by supplying consecutive programming pulses to the memory cells (one pulse is supplied at each iteration of step 160 in FIG. 1), and verifying after each pulse if the programming has succeeded (steps 120, 130). More particularly, at step 110, the memory receives a program command. At step 114, the memory extracts the program address PA and the program data PD from the program command, and the memory loads PA and PD into appropriate registers. PA is the address of the memory word to be written with data PD. The word has 16 memory cells, denoted Q0–Q15 in step 160. Each bit of data PD corresponds to one memory cell. If the bit is 0, the corresponding cell is to be programmed. If the bit is 1, the corresponding cell is to be left unchanged (the cells are presumed to have been erased).

Also at step 114 the memory initializes a pulse count register PC to 0.

At step 120 ("program verify"), the memory word Q0–Q15 is read out of the memory array. At step 130, that word is compared to PD. If the result is "Pass", i.e. the word Q0–Q15 already has the data PD, then the programming is completed with a PASS indication (step 134). If the comparison fails, the pulse counter PC is checked at step 140. If PC equals some maximum value PCmax (e.g. 255), the programming is terminated with a FAIL indication (step 150). If not, a programming current pulse is supplied to the memory cells corresponding to the 0 bits of the PD value (step 160), the PC counter is incremented (step 170), and control returns to program-verify step 120.

Step 160 involves application of a "super high" voltage to the memory cells being programmed. The super high voltages are voltages exceeding the normal operational voltages used to read the memory. The super high voltages are generated by charge pumps from normal power supply voltages supplied from external sources. The charge pumps are typically located on the same chip as the memory. A charge pump capable of providing a sufficient current drive for simultaneous programming of up to 16 memory cells needs a large area.

To reduce the charge pump current drive requirements, the programming method can be modified as shown in FIG. 2. Step 160 is replaced with steps 160.1, 160.2, 160.3, 160.4 performed sequentially. At each step, at most four memory cells are programmed. The programming is performed on bits (cells) Q0–Q3 at step 160.1, bits Q4–Q7 at step 160.2, bits Q8–Q11 at step 160.3, and bits Q12–Q15 at step 160.4. (The programming involves supplying a programming pulse to the cells corresponding to the 0's in the PD value.) The programming current requirements are reduced, but the programming time is increased.

Another variation is described in U.S. Pat. No. 5,644,531 issued Jul. 1, 1997 to Kuo et al. In that variation, the charge pump can generate sufficient programming current for five memory bits. The memory detects the number of 0's in the high byte of the PD data (the byte corresponding to bits Q0–Q7) and the number of 0's in the low byte (Q8–Q15). If the total number of 0's in the two bytes is at most five, the programming proceeds as in FIG. 1 (all of the 16 bits are programmed simultaneously). If the number of 0's in each of the bytes Q0–Q7 and Q8–Q15 is greater than five, the programming is performed as in FIG. 2. If the number of 0's in byte Q0–Q7 is at most five but the number of 0's in byte Q7–Q15 is greater than five, then the bits Q0–Q7 are programmed simultaneously, but the bits Q8–Q15 are programmed sequentially in groups of four. If the number of 0's in byte Q0–Q7 is greater than five but the number of 0's in byte Q7–Q15 is at most five, then the bits Q0–Q7 are programmed sequentially in groups of four but the bits Q8–Q15 are programmed simultaneously.

SUMMARY

In some embodiments, of the present invention, data are written to a plurality of nonvolatile memory cells as follows. A data writing signal is supplied to one of the memory cells but not to both of the memory cells. Then data writing signals are supplied to both memory cells simultaneously.

Other embodiments are described below. The invention is defined by the appended claims.

DESCRIPTION OF SOME EMBODIMENTS

Figure 1:
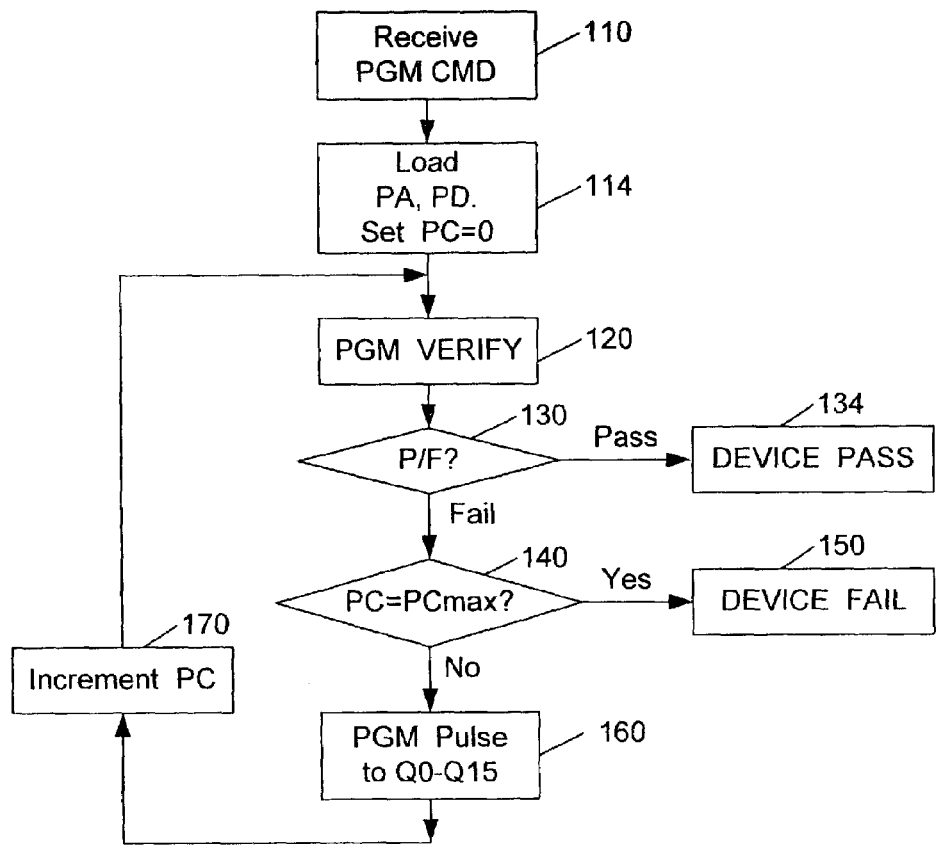
FIGS. 1 and 2 are flowcharts of prior art flash memory programming methods.
Figure 2:
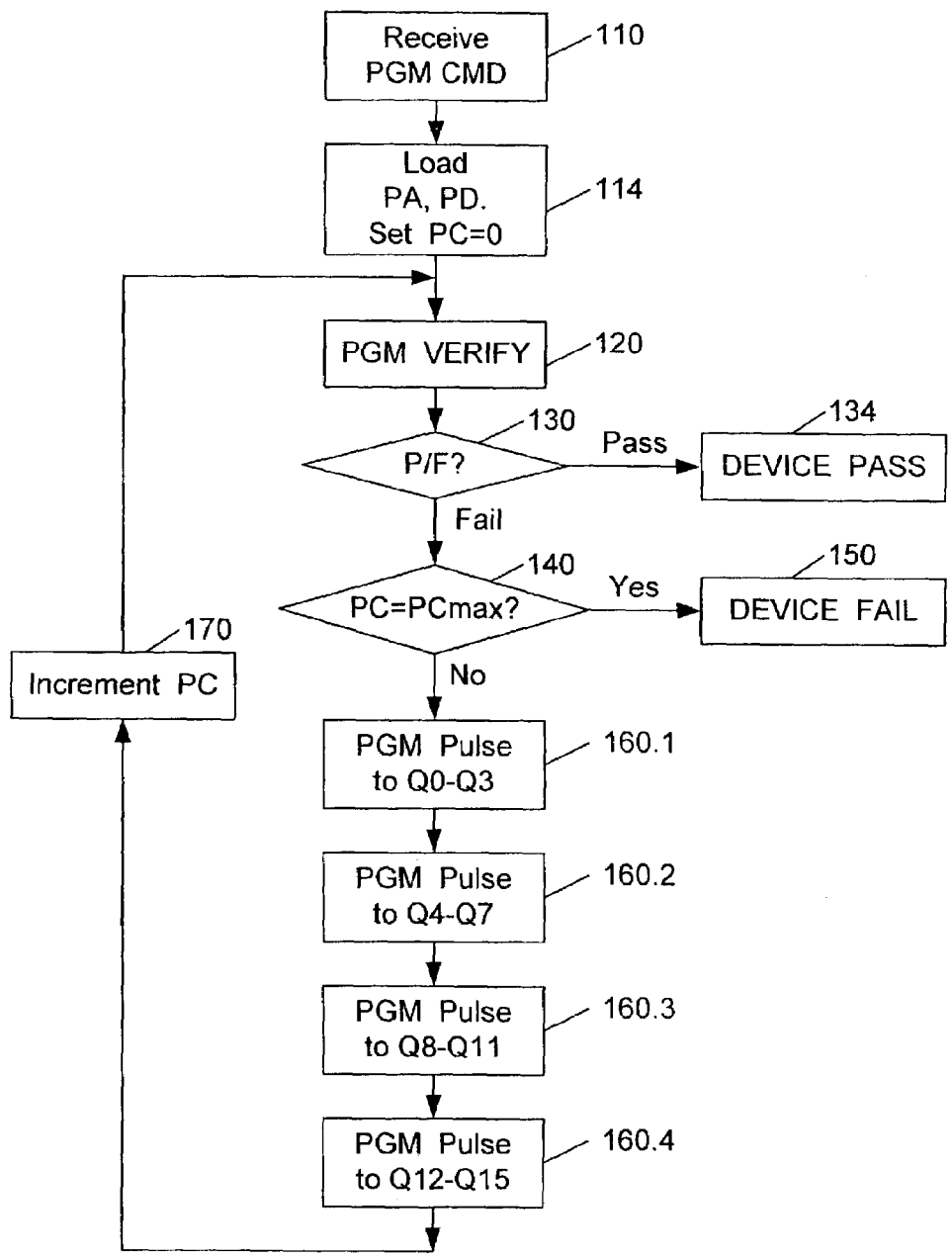

The inventors have observed that when a memory cell is being programmed by channel hot electron injection, the programming current gradually decreases. Therefore, the maximum current required to program multiple cells can be reduced if the programming starts as in FIG. 2 (in groups of four bits), and then proceeds as in FIG. 1. At the beginning, the maximum programming current per cell is high, so the programming proceeds as in FIG. 2 to reduce the total programming current required. Later, the maximum programming current per cell decreases, and the programming proceeds as in FIG. 1. The programming time can be reduced relative to the method of FIG. 2.

Figure 3:
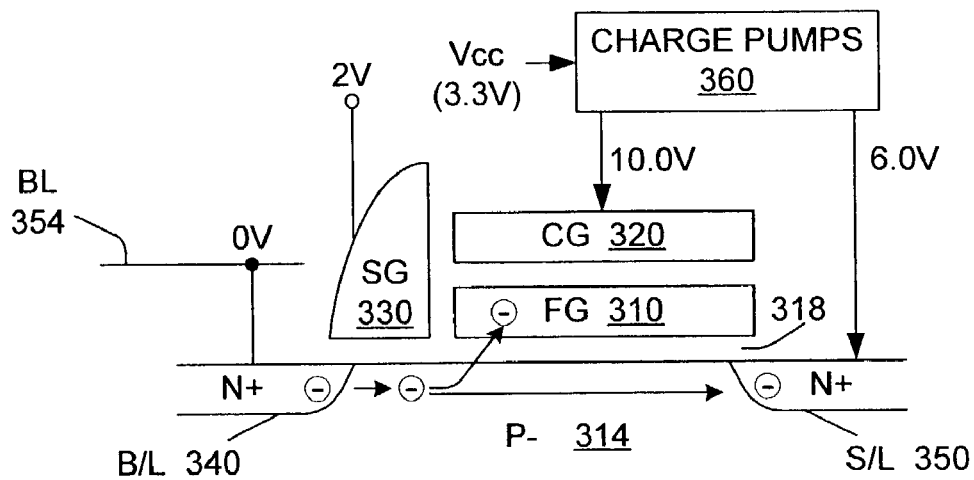
FIG. 3 illustrates a cross section of a nonvolatile memory cell used in one embodiment of the present invention.

One embodiment of the present invention will now be illustrated on the example of a memory cell shown in FIG. 3. The cell is described in U.S. Pat. No. 6,355,524 issued Mar. 12, 2002 to Tuan et al., incorporated herein by reference. Conductive floating gate 310 is formed over a P well 314 (doped P-) of a monocrystalline silicon substrate. Floating gate 310 is insulated from the substrate by silicon dioxide 318 ("tunnel oxide"). Conductive control gate 320 overlies the floating gate and is insulated from the floating gate. Control gate 320 is part of a control gate line that provides control gates to one row of memory cells. Select gate 330 is formed over the well 314 next to the floating and control gates (the select gate is a spacer on a sidewall of a stacked structure which includes the floating and control gates). Select gate 330 is insulated from control gate 320, floating gate 310, and well 314 by dielectric layers. Select gate 330 is part of a wordline which provides select gates for one row of the memory cells.

N+ source/drain regions 340, 350 are formed in well 314. Region 340 is called a "bitline region" because it is connected to a bitline 354. Region 350 is called a "source line region". It is part of a source line providing the source line regions to one row of the memory cells.

FIG. 3 illustrates exemplary programming voltages. Control gate 320 is at 10.0V. Bitline region 340 is at 0V. Source line region 350 is at 6.0V. Select gate 330 is at 2V (Vcc is in the range of 2.6V to 3.3V). Hot electrons generated in the channel region (the P type region extending between the regions 340, 350) penetrate the oxide 318 and reach the floating gate 310.

Voltage Vcc is supplied to the memory from an external source (not shown). Charge pumps 360 fabricated on the same chip as the memory provide the super-high programming voltages of 10.0V and 6.0V. The charge pump that provides 6.0V to source line region 350 must supply the programming current through this region.

Figure 4:
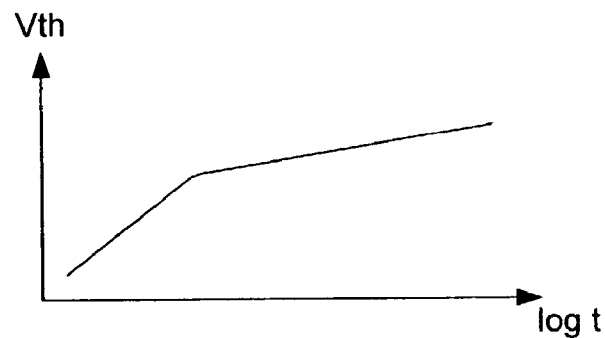
FIG. 4 is a graph illustrating the programming of the cell of FIG. 3.

As more and more electrons reach the floating gate, the cell's threshold voltage Vth (the control gate voltage required to render the cell conductive) increases. FIG. 4 shows the plot of Vth versus time, more precisely Vth versus the logarithm "log t" where t is the time in which the voltages of FIG. 3 are being applied to the cell. As Vth increases, the current through source line region 350 decreases. Therefore, less current is drawn at a later programming stage than at the beginning.

Figure 5:
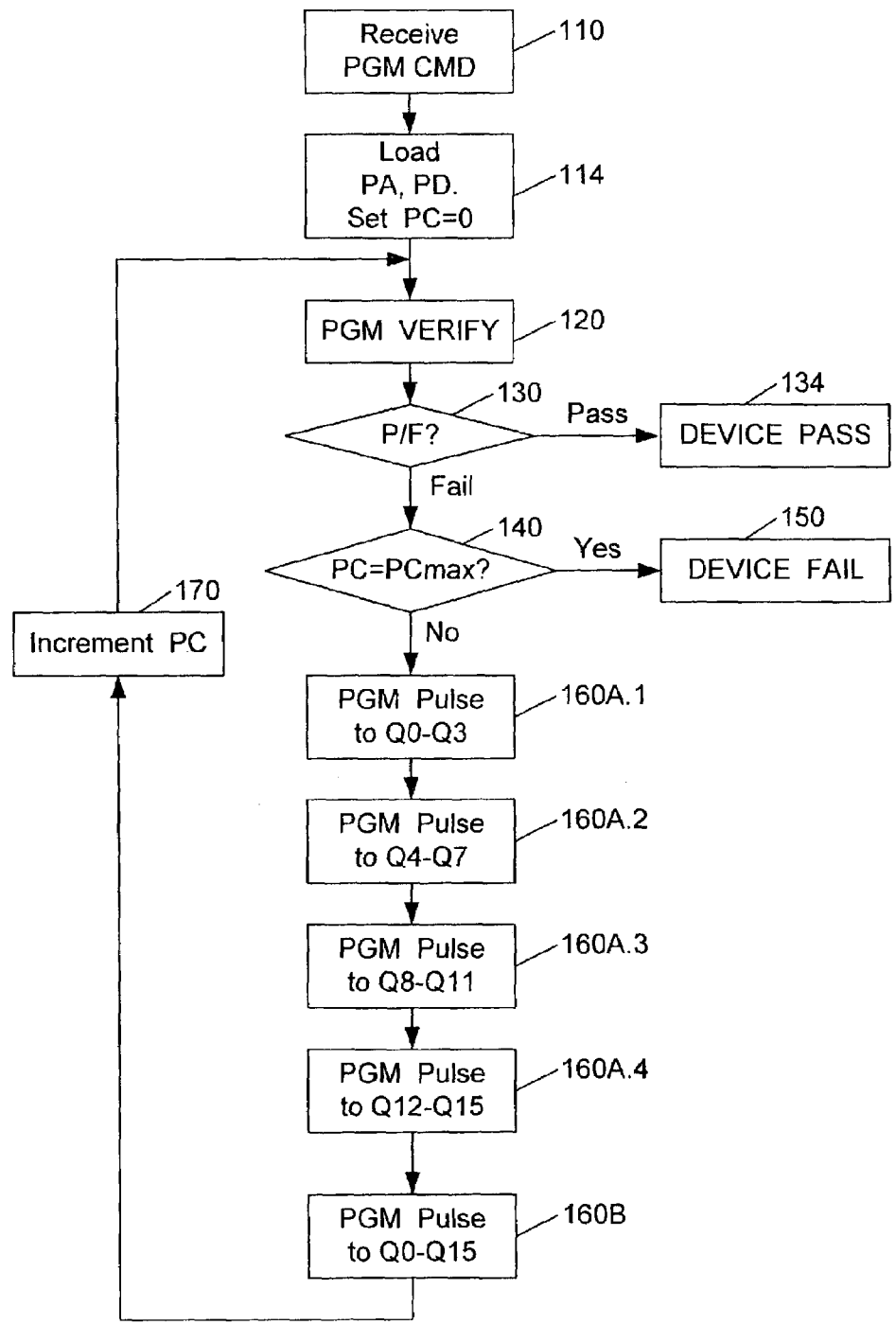
FIG. 5 is a flowchart of a flash memory programming method according to one embodiment of the present invention.

FIG. 5 illustrates a suitable programming method. The method is identical to that of FIG. 1 except that the programming step 160 is replaced by programming steps 160A.1, 160A.2, 160A.3, 160A.4, 160B, performed sequentially in that order. Steps 160A.1–160A.4 are identical to respective steps 160.1–160.4 of FIG. 2. At each of these steps, the programming is performed on four of the bits Q0–Q15. (The programming is actually performed only on the bits that correspond to the 0 values of the PD data.) The threshold voltages of the memory cells corresponding to the 0 values of the PD data are increased at these steps. Then at step 160B, the programming is performed simultaneously on all of the 16 bits Q0–Q15 (again, only on the bits corresponding to the 0 values of the PD data; this clarification is sometimes omitted below).

The invention is not limited to the numbers of bits involved. For example, a memory word may have 8 bits, 32 bits, or any other number of bits. The word may be subdivided into subsets of bits. In FIG. 5, there are four subsets, Q0–Q3, Q4–Q7, Q8–Q11, and Q12–Q15. More generally, there may be any number of subsets (greater than 1), and each subset may include any number of bits. For example, an 8-bit word Q0–Q7 can be divided into eight subsets of one bit each, or four subsets of 2 bit each, or 3 subsets Q0–Q2, Q3–Q5, and Q6–Q7 (the subsets do not have to have the same number of bits). First, each subset is programmed separately, with only one subset being programmed at any given time. Then all of the subsets (the whole word) are programmed simultaneously.

In another variation, the subsets are first programmed separately, one at a time, but then some combination of subsets, but less than all of the subsets, are programmed simultaneously. For example, suppose the memory word Q0–Q15 is divided into four subsets Q0–Q3, Q4–Q7, Q8–Q11, Q12–Q15 (as in FIG. 5). The programming may proceed as follows:

A1. Programming pulse to Q0–Q3.
A2. Programming pulse to Q4–Q7.
A3. Programming pulse to Q8–Q11.
A4. Programming pulse to Q12–Q15.
A5. Programming pulse to Q0–Q7.
A6. Programming pulse to Q8–Q15.
A7. Programming pulse to Q0–Q15.

In another variation, at step A5, a programming pulse is supplied to Q1–Q8, and at step A6 to Q0 and Q9–Q15. In another variation, step A7 is omitted.

In another variation, the programming is performed as follows:

B1. Programming pulse to Q0–Q7.
B2. Programming pulse to Q0–Q15.

In this variation, the threshold voltages of the cells Q0–Q7 corresponding to the 0 bits in the PD value are increased at step B1, so less current is needed at step B2.

The techniques of the present invention can be combined with other techniques, e.g. with the method described in the aforementioned U.S. Pat. No. 5,644,531 which is incorporated herein by reference. In other words, the subsets can be defined dynamically based on the number and position of 0's in the PD value. The programming pulses can first be applied to the subsets one subset at a time, as in U.S. Pat. No. 5,644,531. Then a programming pulse can be applied to the whole word.

In FIG. 5, the program verify steps 120, 130 are performed after performing all of the steps 160A1–160A.4, 160.B. The program verify steps can also be performed between the steps 160A.4 and 160B, or at other stages. The program-verify steps can also be omitted.

In FIG. 5, at each iteration, steps 160A.1–160A.4 are performed exactly once before the step 160B. In other embodiments, steps 160A.1–160A.4 can be repeated multiple times before step 160B, and/or the step 160B can be performed multiple times after each or multiple iterations of steps 160A.1–160A.4. Other perturbations of the programming steps are possible.

The invention is not limited to the bits Q0–Q15 being part of a single addressable word. The invention is applicable to programming of large amounts of data, e.g. 64K bit pages. Each page can be subdivided into subsets, and different subsets can be programmed one at a time, and then a combination of subsets (possibly the whole page) can be programmed simultaneously.

Figure 6:
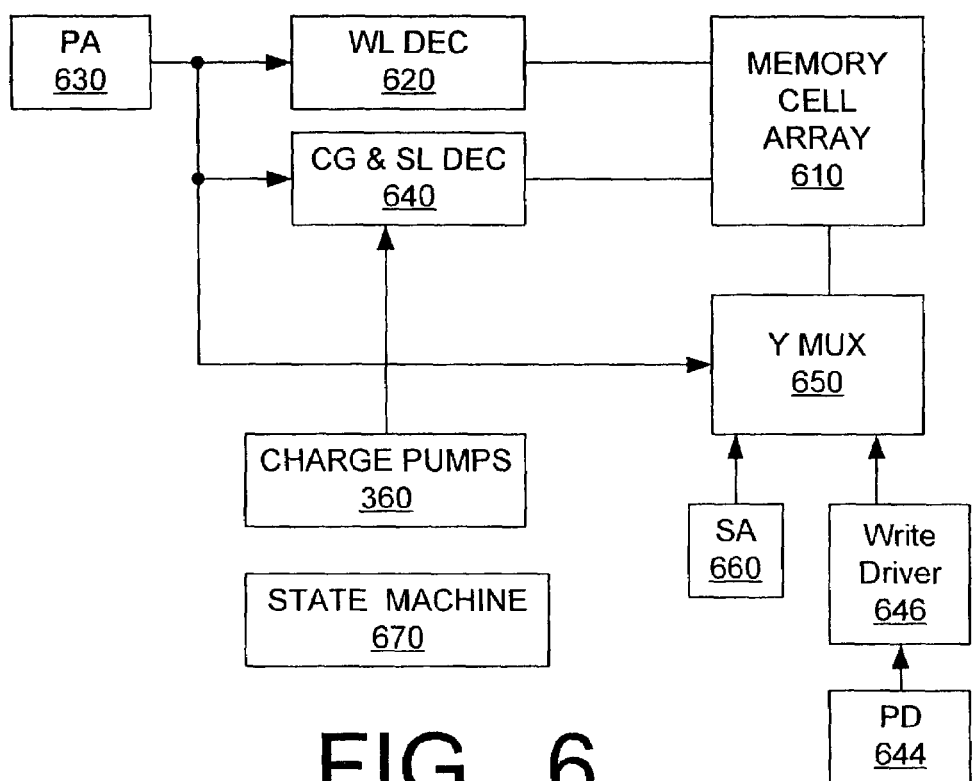
FIG. 6 is a block diagram of a nonvolatile memory according to one embodiment of the present invention.

FIG. 6 illustrates a possible block diagram of the memory. Array 610 is an array of memory cells such as shown in FIG. 3. Wordline decoder 620 selects a word line 330 (FIG. 3) in response to address PA in register 630. Decoder 640 selects the control gate lines 320 and the source lines 350. (In some embodiments, decoder 640 selects a global control gate line and a global source line which are connected to local decoders, not shown. The local decoders select control gate line 320 and source line 350. See U.S. patent application Ser. No. 10/397,478 filed by Jongmin Park and Li-Chun Li on Mar. 25, 2003 and incorporated herein by reference.)

Decoder 640 receives the 10.0V and 6.0V voltages from charge pumps 360 and provides them to control gate lines 320 and source lines 350.

Register 644 stores the PD value. Write driver 646 drives to PD value in regions 644 to Y multiplexer 650.

Y multiplexer 650 selects bitlines 354 in response to the address PA. (In some embodiments, the Y multiplexer 650 selects a global bitline connected to local decoders, not shown, that select the bitlines 354.) The bitlines corresponding to the 0 bits of the PD value are grounded (see FIG. 3). The bitlines corresponding to the 1 bits of the PD value are driven to Vcc to suppress the programming of the corresponding memory cells.

Sense amplifiers 660 sense the states of bitlines 354 in the read and program-verify operation. State machine 670 supplies control signals for the memory.

The invention is not limited to the circuitry of FIG. 6, or to any particular memory array and accompanying circuitry, or even to memory arrays. For example, an integrated circuit may have only two nonvolatile memory cells. In a first iteration, the programming current can be delivered to the cells one after the other. In a second iteration, the programming current can be delivered to the cells simultaneously. The invention is not limited to the presence or use of PA, PD and PC registers, use or position of charge pumps (which can be on the same chip as the memory or off the chip, or can be absent).

The invention is applicable to cells that are "programmed" by storing a positive charge on the floating gate, and "erased" by storing a negative charge. See U.S. Pat. No. 5,932,908 issued Aug. 3, 1999 to Noble, entitled "TRENCH EPROM", incorporated herein by reference. For example, the cells can be programming by storing a positive charge on the floating gate, and can be erased using the techniques of the present invention. The invention does not depend on characterizing a data writing operation as "programming" or "erasing". The invention is applicable to multi-level cells. The invention is applicable to non-flash memories. The invention is not limited to the cell structures of FIG. 3. The invention is applicable to stacked gate memory cells and other cell types. In the cell of FIG. 3, the memory is written by changing the charge on the conductive floating gate. In some embodiments, the memory is written by changing the charge trapped by a dielectric region, e.g. a silicon nitride region. See e.g. U.S. Pat. No. 6,459,618 issued Oct. 1, 2002 to Wang, incorporated herein by reference. Thus, the charge storage region can be a conductive region (a conductive floating gate) or a dielectric.

While in the example of FIG. 3 the cell is programmed by repeated application of the same voltages, in other embodiments the voltages can change from one pulse to another. The duration or other parameters of each pulse can also change. Other programming techniques may be used, known or to be invented. The invention is defined by the appended claims.

What is claimed is:

1. A method for writing a data item into a nonvolatile memory, wherein the writing of a data item requires changing states of at least a first nonvolatile memory cell and a second nonvolatile memory cell by supplying data writing signals to the first and second memory cells, the method comprising:
   determining, based on the data item, first data to be written to the first memory cell and second data to be written to the second memory cell; and
   writing the first and second data to the respective first and second cells, wherein the writing of the first and second data comprises:
   (a) supplying a data writing signal to the first memory cell but not the second memory cell to write said data item; and then
   (b) supplying data writing signals simultaneously to the first and second memory cells to write said data item;
   wherein writing the first data to the first memory cell comprises both operations (a) and (b), but writing the second data to the second memory cell comprises the operation (b) but not the operation (a).

2. The method of claim 1 wherein supplying a data writing signal to the first memory cell comprises supplying one or more voltages to one or more terminals of the first memory cell, and supplying a data writing signal to the second memory cell comprises supplying one or more voltages to one or more terminals of the second memory cell.

3. The method of claim 1 wherein changing the states of the first and second memory cells comprises hot electron injection into charge storage areas of the first and second memory cells.

4. The method of claim 3 wherein the charge storage area of each of the first and second memory cells comprises a conductive floating gate.

5. The method of claim 1 further comprising, before the operation (b):
   (c) supplying a data writing signal to the second memory cell but not the first memory cell to write said data item;
   wherein the operation (c) is part of writing the second data to the second memory cell but not part of writing the first data to the first memory cell.

6. The method of claim 1 wherein changing the state of any one of the first and second memory cells comprises passing a current through said one of the first and second cells, said current decreasing as the state is being changed.

7. The method of claim 1 wherein the operation (b) comprises simultaneously supplying a data writing signal to each memory cell to which a data writing signal was supplied in the operation (a).

8. The method of claim 7 wherein changing the state of any one of the memory cells comprises passing a current through said one of the cells, said current decreasing as the state is being changed.

9. The method of claim 3 wherein a threshold voltage of the first memory cell is higher at the beginning of (b) than at the beginning of (a).

10. The method of claim 1 wherein the operation (a) increases a threshold voltage of the first memory cell but not a threshold voltage of the second memory cell, and the operation (b) further increases the threshold voltage of the first memory cell.

11. The method of claim 10 wherein the operation (b) increases the threshold voltages of the second memory cell.

12. A method for writing a data item into a nonvolatile memory comprising a plurality of memory cells, wherein the plurality of memory cells comprises at least a first set of one or more nonvolatile memory cells and a second set of one or more nonvolatile memory cells, the method comprising:
   determining, based on the data item, which, if any, memory cells of the first and second sets are to be supplied with data writing signals;
   (a) performing a data writing operation on the first set of the memory cells but not the second set of the memory cells, wherein this operation (a) comprises, if any cells of the first set are to be supplied with data writing signals as determined in the determining operation, then simultaneously supplying the data writing signals to all of the cells of the first set determined in the determining operation but not supplying data writing signals to any cell of the second set; and then
   (b) performing a data writing operation on a set which includes at least the first and second sets of the memory cells, wherein this operation (b) comprises, if any cells of the first and second sets are to be supplied with data writing signals as determined in the determining operation, then simultaneously supplying the data writing signals to all of the cells of the first and second sets determined in the determining operation.

13. The method of claim 12 further comprising, before (b): (c) performing a data writing operation on the second set but not the first set, wherein this operation (c) comprises, if any cells of the second set are to be supplied with data writing signals as determined in the determining operation, then simultaneously supplying the data writing signals to all of the cells of the second set determined in the determining operation but not supplying data writing signals to any cell of the first set.

14. The method of claim 12 wherein a maximum current through the first set is lower in (b) than in (a).

15. The method of claim 12 wherein the operation (b) comprises simultaneously supplying a data writing signal to each memory cell to which a data writing signal was supplied in the operation (a).

16. The method of claim 15 wherein a current through each of the cells to which a data writing signal is supplied decreases in the data writing operation.

17. The method of claim 12 wherein each cell to which a data writing signal is supplied is programmed by hot electron injection, and a threshold voltage of each cell to which a data writing signal is supplied decreases during the hot electron injection.

18. The method of claim 12 wherein the determining operation determines at least one cell of the first set and at least one cell of the second set;
wherein a maximum current through said cell of the first set is lower in (b) than in (a).

19. An apparatus comprising:
a plurality of nonvolatile memory cells;
circuitry for executing a command whose execution involves writing a data item into a set of the nonvolatile memory cells, said set comprising a first subset having one or more nonvolatile memory cells and a second subset having one or more nonvolatile memory cells, wherein the circuitry comprises a first circuit for:
determining, based on the command, first data to be written into the first subset and second data to be written into the second subset;
writing the first and second data to the respective first and second subsets, wherein the writing of the first and second data comprises:
(a) supplying a data writing signal to the first subset but not the second subset to write the data item; and then
(b) supplying data writing signals simultaneously to the first and second subsets to write the data item;
wherein writing the first data to the first subset comprises both operations (a) and (b), but writing the second data to the second subset comprises the operation (b) but not the operation (a).

20. The apparatus of claim 19 wherein the first circuit comprises circuitry for verifying a condition, and performing the operation (a) only if the condition is true.

21. The apparatus of claim 20 wherein the condition is that said set does not yet store the data item.

22. The apparatus of claim 19 wherein the first circuit comprises circuitry for verifying a condition, and performing (b) only if the condition is true.

23. The apparatus of claim 19 wherein the first circuit comprises a second circuit for:
determining, based on the data item, which, if any, memory cells of the set are to be supplied with data writing signals;
performing the operation (a) only if the second circuit has determined that one or more of the memory cells of the first subset are to be supplied with data writing signals; and
performing the operation (b) only if the second circuit has determined that one or more of the memory cells of the union of the first and second subsets are to be supplied with data writing signals.

24. The apparatus of claim 19 wherein the circuitry is operable to perform, before (b)
(c) supplying a data writing signal to the second subset but not the first subset to write the data item;
wherein the operation (c) is part of writing the second data to the second subset but not part of writing the first data to the first subset.

25. The apparatus of claim 19 wherein writing any one of the memory cells comprises passing a gradually decreasing current through said any one of the cells.

26. The apparatus of claim 19 wherein the operation (b) comprises simultaneously supplying a data writing signal to each memory cell to which a data writing signal was supplied in the operation (a).

27. The apparatus of claim 26 wherein writing any one of the memory cells comprises passing a current through said any one of the cells, the current decreasing during the writing of said any one of the cells.

28. The apparatus of claim 19 wherein the current through the first memory subset during (b) has a lower maximum value than during (a).

29. The apparatus of claim 19 wherein each cell to which a data writing signal is supplied is programmed by hot electron injection, and a threshold voltage of each cell to which a data writing signal is supplied decreases during the hot electron injection.

30. The apparatus of claim 19 wherein for at least one cell of the first subset, a maximum current through said cell is lower in (b) than in (a).

31. A method for writing a data item into a nonvolatile memory, wherein the writing of a data item requires changing states of at least a first nonvolatile memory cell and a second nonvolatile memory cell by supplying data writing signals to the first and second memory cells, the method comprising:
(a) supplying a data writing signal to the first memory cell but not the second memory cell to increase a threshold voltage of the first memory cell but not a threshold voltage of the first memory cell; and then
(b) supplying data writing signals simultaneously to the first and second memory cells to further increase the threshold voltages of each of the first and second memory cells.

32. The method of claim 31 wherein a maximum current through the first memory cell is lower in (b) than in (a).

* * * * *